United States Patent
Yan et al.

(10) Patent No.: US 8,530,355 B2
(45) Date of Patent: Sep. 10, 2013

(54) MIXED ORIENTATION SEMICONDUCTOR DEVICE AND METHOD

(75) Inventors: Jiang Yan, Newburgh, NY (US); Danny Pak-Chum Shum, Poughkeepsie, NY (US); Armin Tilke, Beacon, NY (US)

(73) Assignee: Infineon Technologies AG, Neubiberg (DE)

( * ) Notice: Subject to any disclaimer, the term of this patent is extended or adjusted under 35 U.S.C. 154(b) by 1424 days.

(21) Appl. No.: 11/317,737

(22) Filed: Dec. 23, 2005

(65) Prior Publication Data
US 2007/0148921 A1    Jun. 28, 2007

(51) Int. Cl.
*H01L 21/311* (2006.01)

(52) U.S. Cl.
USPC .......................... 438/697; 438/700

(58) Field of Classification Search
None
See application file for complete search history.

(56) References Cited

U.S. PATENT DOCUMENTS

| | | | |
|---|---|---|---|
| 3,476,991 A | 11/1969 | Mize et al. | |
| 3,603,848 A | 9/1971 | Sato et al. | |
| 3,612,960 A | 10/1971 | Takeishi et al. | |
| 3,634,737 A | 1/1972 | Maeda et al. | |
| 4,768,076 A | 8/1988 | Aoki et al. | |
| 4,857,986 A | 8/1989 | Kinugawa | |
| 4,878,957 A | 11/1989 | Yamaguchi et al. | |
| 5,110,755 A * | 5/1992 | Chen et al. | 438/409 |
| 5,384,473 A * | 1/1995 | Yoshikawa et al. | 257/255 |
| 5,593,915 A * | 1/1997 | Ohoka | 438/152 |
| 5,688,893 A | 11/1997 | Rahman et al. | |
| 5,994,188 A | 11/1999 | Disney | |
| 6,017,801 A | 1/2000 | Youn | |
| 6,294,803 B1 | 9/2001 | Gil | |
| 6,346,451 B1 * | 2/2002 | Simpson et al. | 438/311 |
| 6,436,748 B1 | 8/2002 | Forbes et al. | |
| 6,815,277 B2 | 11/2004 | Fried et al. | |
| 6,835,981 B2 | 12/2004 | Yamada et al. | |
| 6,900,503 B2 | 5/2005 | Oh et al. | |
| 6,902,962 B2 | 6/2005 | Yeo et al. | |
| 6,967,132 B2 | 11/2005 | Gonzalez et al. | |
| 6,967,351 B2 | 11/2005 | Fried et al. | |
| 6,972,478 B1 | 12/2005 | Waite et al. | |

(Continued)

FOREIGN PATENT DOCUMENTS

DE    10 2006 028 224 A1    12/2006
EP           0 852 416 A1     7/1998

(Continued)

OTHER PUBLICATIONS

Yang J., et al., "Edge Transistor Elimination in Oxide Trench Isolated N-Channel Metal-Oxide-Semiconductor Field Effect Transistors," 2001 American Vacuum Society, Feb. 5, 2001, pp. 327-332.

(Continued)

*Primary Examiner* — David E Graybill
(74) *Attorney, Agent, or Firm* — Slater & Matsil, L.L.P.

(57) ABSTRACT

A method of making a semiconductor device begins with a semiconductor wafer that includes a first semiconductor layer overlying a second semiconductor layer. A first trench is etched in the semiconductor wafer. The first trench is filled with insulating material. A second trench is etched within the first trench and through the insulating material, such that insulating material remains along sidewalls of the first trench. The second trench exposes a portion of the second insulating layer. A semiconductor layer can then be grown within the second trench using the second semiconductor layer as a seed layer.

22 Claims, 6 Drawing Sheets

(56) References Cited

U.S. PATENT DOCUMENTS

| | | |
|---|---|---|
| 7,193,878 B2 | 3/2007 | Kwak et al. |
| 7,208,815 B2 * | 4/2007 | Chen et al. ............. 257/627 |
| 7,329,923 B2 * | 2/2008 | Doris et al. ............. 257/347 |
| 7,381,624 B2 * | 6/2008 | Wei et al. ............... 438/406 |
| 7,388,278 B2 * | 6/2008 | Holt et al. ............... 257/627 |
| 7,429,506 B2 * | 9/2008 | Passlack ................. 438/216 |
| 7,432,149 B2 * | 10/2008 | Wu et al. ................ 438/222 |
| 7,439,108 B2 * | 10/2008 | Hsu et al. ............... 438/150 |
| 7,439,542 B2 * | 10/2008 | Yang ........................ 257/64 |
| 2002/0132432 A1 | 9/2002 | Blanchard |
| 2002/0146888 A1 | 10/2002 | Ryu et al. |
| 2004/0020518 A1 * | 2/2004 | DeYoung et al. ......... 134/30 |
| 2004/0070045 A1 | 4/2004 | Suguro et al. |
| 2004/0075123 A1 * | 4/2004 | Fraboulet et al. ....... 257/288 |
| 2004/0082164 A1 | 4/2004 | Chen et al. |
| 2004/0082165 A1 | 4/2004 | Kuroi et al. |
| 2004/0121507 A1 | 6/2004 | Bude et al. |
| 2004/0178452 A1 | 9/2004 | Miyasaka |
| 2004/0180496 A1 * | 9/2004 | Hsiao et al. ............ 438/257 |
| 2004/0195646 A1 | 10/2004 | Yeo et al. |
| 2004/0253773 A1 | 12/2004 | Kang |
| 2004/0256700 A1 * | 12/2004 | Doris et al. ............. 257/627 |
| 2005/0006704 A1 * | 1/2005 | Ning et al. ............... 257/350 |
| 2005/0116290 A1 | 6/2005 | De Souza et al. |
| 2006/0049460 A1 * | 3/2006 | Chen et al. ............. 257/347 |
| 2006/0113282 A1 * | 6/2006 | Chang et al. ............. 216/67 |
| 2007/0072377 A1 * | 3/2007 | Passlack ................. 438/285 |
| 2007/0145481 A1 * | 6/2007 | Tilke et al. ............. 257/347 |
| 2007/0148921 A1 * | 6/2007 | Yan et al. ............... 438/481 |

FOREIGN PATENT DOCUMENTS

| | | |
|---|---|---|
| JP | 60-60734 | 4/1985 |
| JP | 60-257541 | 12/1985 |
| JP | 61-18148 | 1/1986 |
| JP | 2-142117 | 5/1990 |
| JP | 3-16150 | 1/1991 |
| JP | 07045526 A * | 2/1995 |
| JP | 9-148426 | 6/1997 |
| JP | 2001-015591 | 1/2001 |
| JP | 2003-100861 | 4/2003 |
| JP | 2003-203968 | 7/2003 |
| JP | 2003-289141 | 10/2003 |

OTHER PUBLICATIONS

Wolf, S., et al., "Silicon Processing for the VLSI Era," vol. 1, Prcess Technology, 2000, pp. 189-202 and 265, Lattice Press, Sunset Beach, Ca.

Japanese Office Action with English Translation (Notification of Reasons for Refusal), Mailing Date: Feb. 1, 2011, Patent Application No. *Tokugan* 2007-520799, 8 pages.

Yang, M., et al., "High Performance CMOS Fabricated on Hybrid Substrate with Different Crystal Orientations," IEDM, 2003, pp. 453-456.

Sheikh, F., et al., "The Impact of Device Orientation on Width-Quantized FinFET Circuits," EE 241, Spring 2004, pp. 1-6.

* cited by examiner

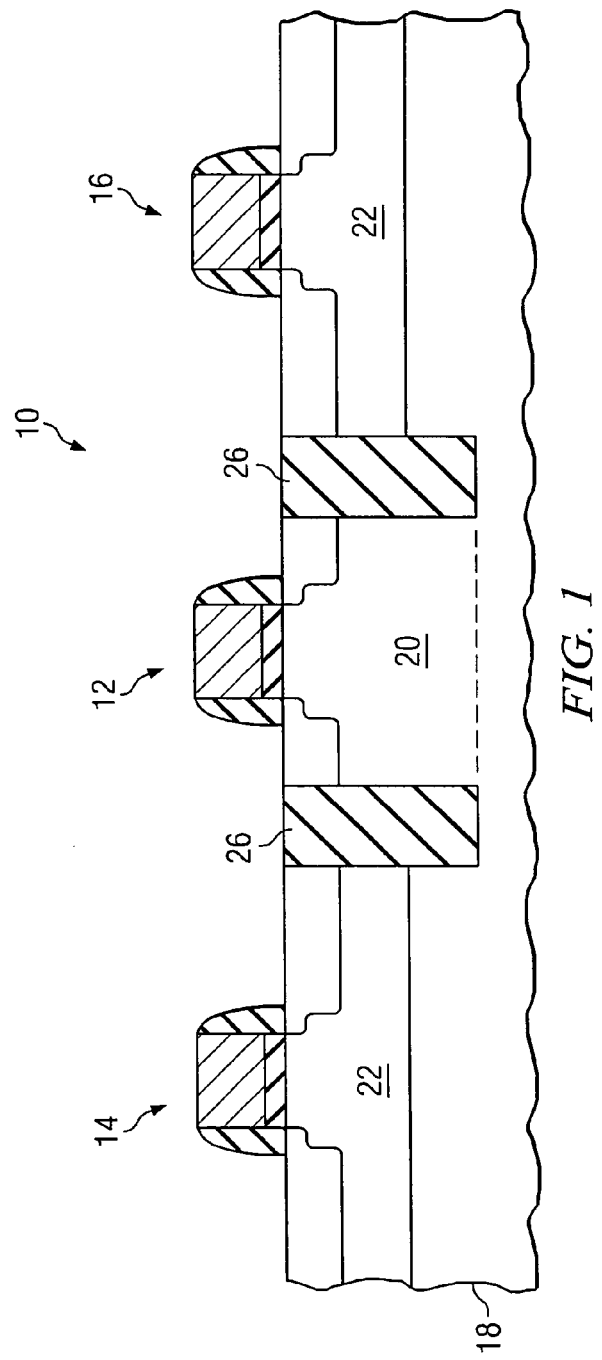
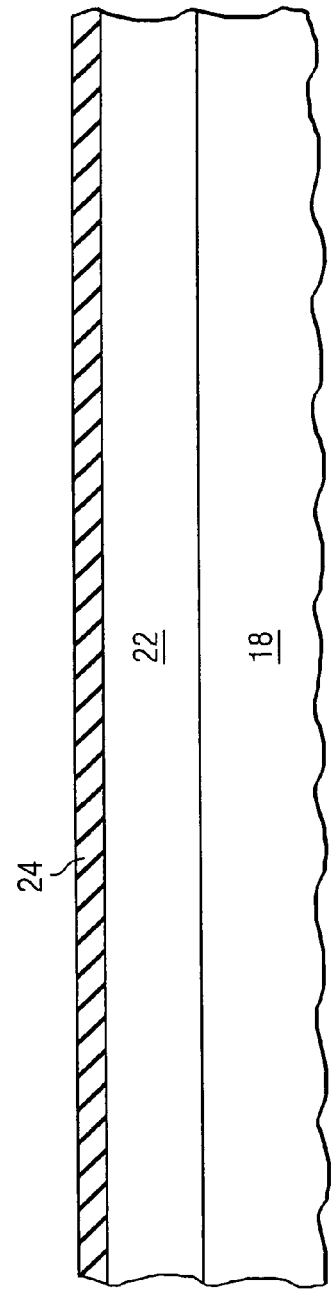

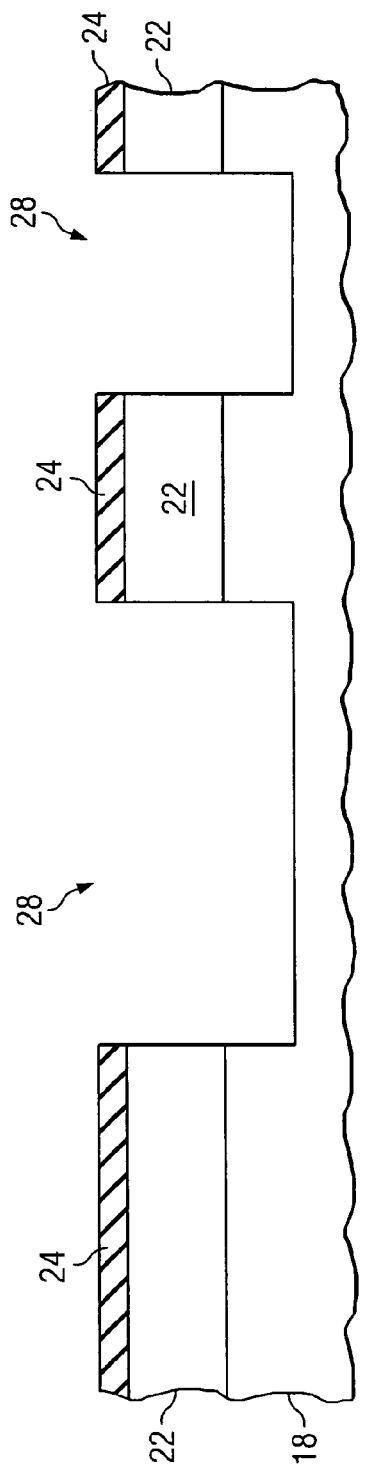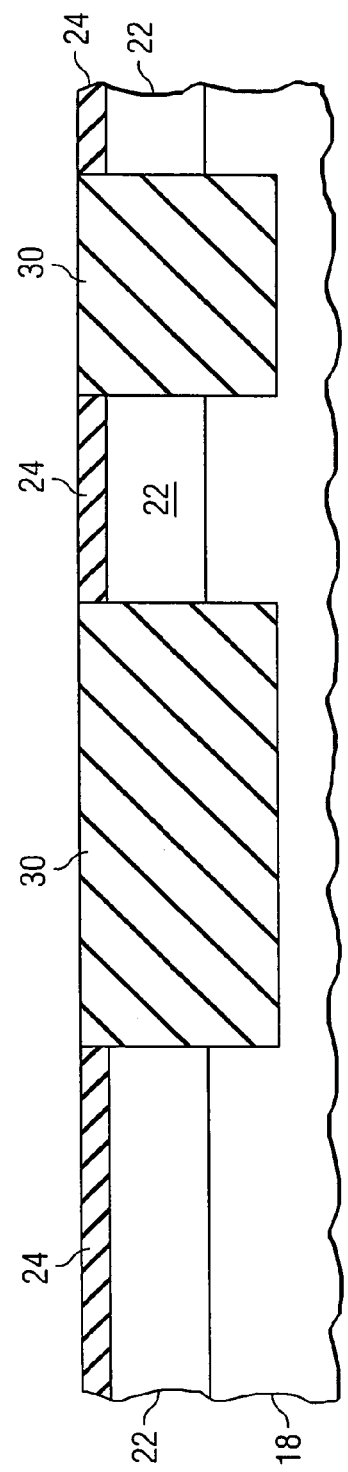

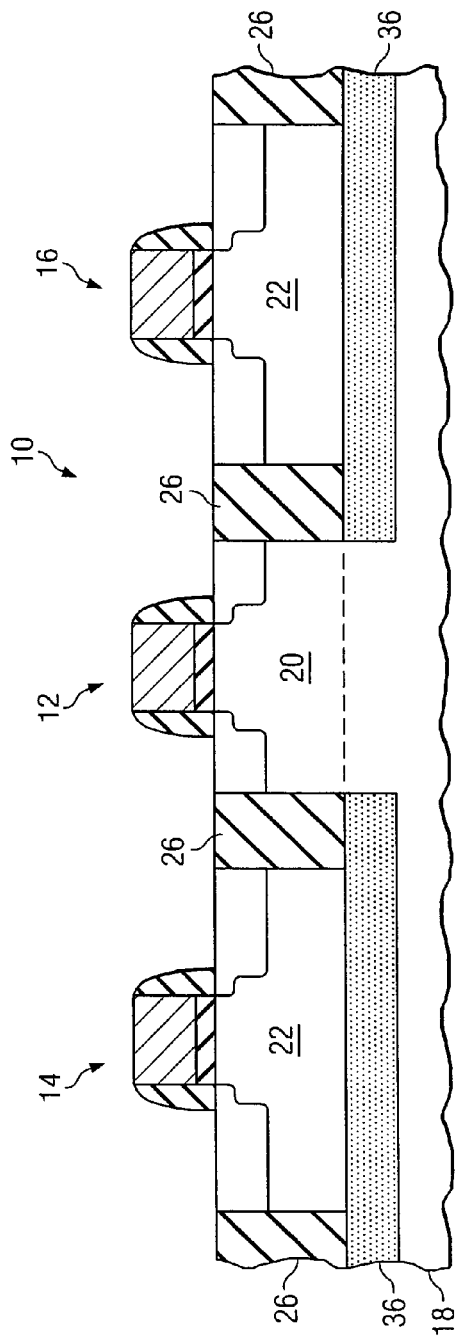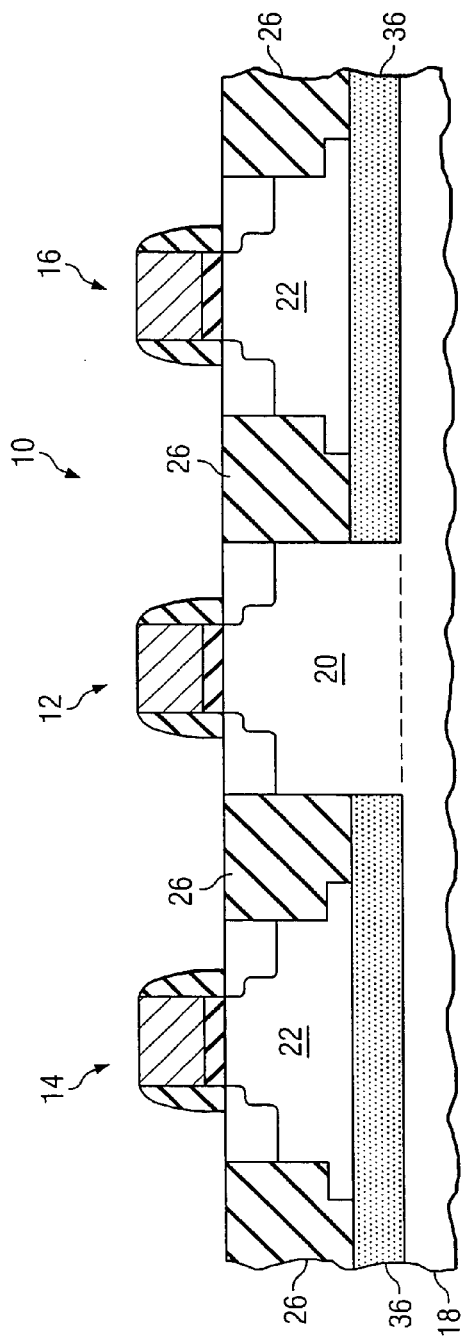

US 8,530,355 B2

MIXED ORIENTATION SEMICONDUCTOR DEVICE AND METHOD

TECHNICAL FIELD

This invention relates generally semiconductor devices and methods, and, in particular embodiments to a mixed orientation semiconductor device and method.

BACKGROUND

Complementary metal oxide semiconductor (CMOS) is a dominant technology in semiconductor device manufacture. A CMOS device includes both n-channel (NMOS) and p-channel (PMOS) transistors. In CMOS technology, both kinds of transistors are used in a complementary way to form a current gate that forms an effective means of electrical control. Advantageously, CMOS transistors use very little power when not switching from one state to another.

It is known that the mobility of carriers is dependent on a number of factors, including the surface plane of a wafer. Conventional silicon substrates typically have a surface oriented on the (100) crystal plane. In this plane, the mobility of electrons is higher than in other crystal planes, and therefore, the source-drain current of an n-channel FET formed on the semiconductor substrate having the (100) plane provides the largest current. However, the mobility of holes is not optimized in the (100) plane, and therefore, the source-drain current of a p-channel FET formed on the semiconductor substrate having the (100) plane is inevitably small. The p-channel FET therefore fails to have desirable characteristics, even though the n-channel FET exhibits good characteristics. Hole mobility could be enhanced, especially at high electric fields, if p-channel FETs were formed on the (110) plane.

U.S. Pat. No. 5,384,473, which is incorporated herein by reference, discloses a semiconductor body having element formation surfaces with different orientations. The semiconductor body is constructed in such a manner that a first semiconductor substrate of the (100) plane is laminated to a second semiconductor substrate of the (110) plane. At least one opening is made in the first semiconductor substrate to expose the second semiconductor substrate. An n-channel transistor can be formed in the first semiconductor substrate while a p-channel transistor is formed in the second semiconductor substrate.

The paper by Yang et al., entitled High Performance CMOS Fabricated on Hybrid Substrate With Different Crystal Orientations," 2003 IEDM, pp. 18.7.1-18.7.4, which is incorporated herein by reference, discloses a structure and technology for high performance CMOS using hybrid silicon substrates with different crystal orientations through wafer bonding and selective epitaxy. This type of mixed orientation substrate (MOS) provides a technology to boost the PMOS performance by using a (110) substrate while maintaining the NMOS performance by using (100) substrate. One of the challenges with a mixed orientation substrate lies in isolating the (110) portions of the substrate from the (100) portions of the substrate and at the same time to make the good alignment with the shallow trench isolation (STI) later on, especially for the technologies below 45 nm.

SUMMARY OF THE INVENTION

Various embodiments of the present invention provide advantages over the prior art.

In a first embodiment, a method of making a semiconductor device begins with a semiconductor wafer that includes a first semiconductor layer overlying a second semiconductor layer. A first trench is etched in the semiconductor wafer. The first trench is filled with insulating material. A second trench is etched within the first trench and through the insulating material such that insulating material remains along sidewalls of the first trench. The second trench exposes a portion of the second insulating layer. A semiconductor layer can then be grown within the second trench using the second semiconductor layer as a seed layer.

The details of one or more embodiments of the invention are set forth in the accompanying drawings and the description below. Other features and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a cross-sectional view of a semiconductor device of the present invention;

FIG. 2 illustrates a bonded wafer;

FIG. 3 illustrates trenches etched in the bonded wafer;

FIG. 4 illustrates the trenches filled with an insulating material;

FIGS. 10-12 illustrate alternate embodiment structures of the present invention.

DETAILED DESCRIPTION OF ILLUSTRATIVE EMBODIMENTS

Figure 5A:
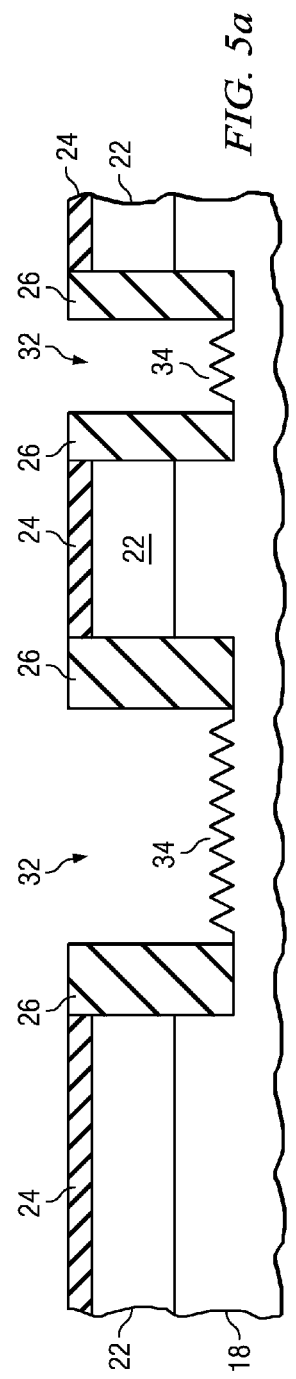
FIG. 5a illustrates trenches within the insulating material wherein the bottom surface of the trenches is rough.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a mixed crystal orientation silicon substrate used to optimize CMOS device performance. The invention may also be applied, however, to other semiconductor devices such as bipolar and BiCMOS and other semiconductors such as silicon germanium.

An exemplary structure of the present invention will be described with respect to FIG. 1. A process flow for manufacturing this structure will then be described with reference to FIGS. 2-8. Alternative methods and structures are then described with respect to FIGS. 9-12.

Referring first to FIG. 1, a semiconductor device 10 includes a first transistor 12 of a first conductivity type and second transistors 14, 16 of a second conductivity type. To enhance performance, the first transistor 12 is formed in a semiconductor material of a first crystal orientation and the second transistors 14 and 16 are formed in semiconductor material of a second crystal orientation. In the preferred embodiment, the first transistor 12 is an n-channel field effect transistor (FET) formed in (100) silicon and the second transistors 14 and 16 are p-channel FETs formed in (110) silicon. In an alternate embodiment, the positions of the (100) orientation semiconductor and (110) orientation semiconductor could be switched with each other. In one embodiment, the body substrate 18 orientation could be either (100) or (110). In other embodiments, other crystal orientations could be used.

To achieve the different crystal orientations, the n-channel transistor 12 is formed in a portion 20 of substrate 18. As will be described below, the portion 20 is preferably epitaxially grown semiconductor material, the material having a crystal orientation that aligns to the crystal orientation of the substrate 18. In the preferred embodiment, substrate 18 is a (100) monocrystalline silicon substrate. Semiconductor 20 is, therefore, also (100) monocrystalline silicon and can be considered a portion of the substrate 18.

The transistors 14 and 16 are formed in portions of a semiconductor layer 22. The semiconductor layer 22 preferably (although not necessarily) has a different crystal orientation from semiconductor material 20. In the preferred embodiment, the semiconductor layer 22 is (110) silicon (and the semiconductor body 20 is (100) silicon). In another embodiment, the semiconductor layer 22 is (100) silicon and the semiconductor body 20 is (110) silicon. In other embodiments, other crystal orientations are used.

The semiconductor region 20 is separated from semiconductor regions 22 by isolation regions 26. Isolation regions 26 are preferably formed from an oxide (e.g., silicon dioxide) but other materials can alternatively be used. As will be discussed below, one advantageous feature of various embodiments of the invention is that the isolation regions 26 and grown semiconductor region 20 are formed in single process module, which simplifies fabrication of the device 10.

A preferred embodiment process for forming a structure of the present invention will now be described with reference to FIGS. 2-8. These figures illustrate one specific process. It is understood, however, that numerous variations and alternatives can be incorporated into the process flow. While the figures reference specific materials (e.g., (100) Si and (110) Si), it is also understood, that other materials, as discussed herein or otherwise recognized by one of ordinary skill in the art, could alternatively be used.

Referring first to FIG. 2, a bonded wafer that includes a first semiconductor layer 18 and a second semiconductor layer 22 is provided. In the illustrated embodiment, the wafer includes a substrate 18, which serves as the first semiconductor layer. In other embodiments, the layer 18 can be formed over a separate substrate, e.g., epitaxially grown. In the preferred embodiment, the substrate 18 comprises a (100) bulk silicon substrate. In other embodiments, the substrate 18 can comprise silicon of different crystal orientations, e.g., (110) or (111), or different semiconductor materials, such as silicon germanium, gallium arsenide.

The semiconductor layer 22 overlies the semiconductor layer 18. In the preferred embodiment, the semiconductor layer 22 is formed from a different crystal orientation semiconductor as compared to the layer 18. For example, in the preferred embodiment the substrate 18 is a (100) bulk silicon substrate and the layer 22 is (110) silicon layer. In another embodiment, these can be reversed, i.e., the substrate 18 is a (110) silicon substrate and the layer 22 is a (100) silicon layer. In yet other embodiments, other crystal orientations or semiconductor materials are used. For example, it is not necessary that the layer 18 and the layer 22 be the same material.

The semiconductor layer 22 can be formed in a variety of ways. For example, the semiconductor layer 22 can be bonded or laminated to the substrate 18. For example, a donor wafer that includes the silicon layer 22 can be bonded to a target wafer 18. During a wafer separation process, such as the Smartcut™ process, a splitting plane in one silicon wafer is defined by hydrogen implantation close beneath the oxide layer. Bonding of the donor wafer to the target wafer and subsequent separation at the pre-defined plane, results in a thin remaining layer of single crystalline silicon 22 on top of the substrate 18. A substrate illustrated in FIG. 2 can also be purchased as such. For example, bonded wafers with two different orientations are commercially available.

FIG. 2 also shows that a hard mask layer 24 has been formed over the semiconductor layer 22. In the preferred embodiment, the hard mask layer 24 is a nitride layer that has been formed over a pad oxide layer. These layers can be formed by known techniques. For example, the nitride layer can be formed with a chemical vapor deposition (CVD) process and the oxide layer can be formed by CVD or thermally grown. In other embodiments, other materials can be used. The hard mask 24 can be one single layer or multiple layers (i.e., two or more).

Referring next to FIG. 3, trenches 28 are formed in the wafer. In the preferred embodiment, a resist layer (not shown) is formed over the hard mask layer 24. The resist layer can be any photoresist used in standard lithography processing. The resist is patterned to expose portions of the hard mask layer 24, which is in turn removed to expose portions of the semiconductor layer 22.

The semiconductor layer 22 is then etched, preferably to expose underlying semiconductor layer 18. The trench 28 can be formed by a reactive ion etch process, as an example. In the illustrated embodiment, the etch process also removes a portion of the layer 18. This feature is not necessary. The etch could stop at the top surface of the layer 18. In another embodiment, the etch could stop before reaching the top surface of layer 18. In this case, a subsequent etch would be performed to expose the layer 22. For example, the etch illustrated in FIG. 5a could remove a portion of insulating layer 30 and an underlying portion of semiconductor layer 18. In preferred embodiments, the depth of the trench 28 will define the depth of the STI regions 26 (shown, e.g., in FIG. 1).

As noted above, the exposed portions of semiconductor layer 22 are removed using the remaining portions of the hard mask layer 24 as a mask. This removal can be done by anisotropic etching. In an embodiment that is not illustrated, the hard mask layer 24 can be replaced with a photoresist.

Referring next to FIG. 4, the trench 28 is filled with insulating material 30. As shown, insulating material 30 is formed where the portions of the semiconductor layer 22 were removed. In the preferred embodiment, an insulating layer is deposited and planarized to be substantially co-planar with the upper surface of semiconductor layer 22. For example, an oxide layer can be deposited using a high density plasma (HDP) process followed by a chemical mechanical polish (CMP) step. In alternate embodiments, the insulating material 30 can be an oxide formed by a different process or a different material such as a nitride or doped glass (e.g., fluorinated silica glass). A liner (not shown) can be formed prior to depositing the insulating material 30, i.e., the insulating material can include multiple layers of material.

Turning now to FIG 5a, a second trench 32 is etched within the first trench 28 to remove portions of the insulating layer. This trench 32 can be formed by a reactive ion etch process, as an example. The second trench 32 is smaller than the first trench 28 so that portions of the insulating material 30 remain along sidewalls of the semiconductor layer 22 (and also layer 18 if the trench extends that deep). This remaining insulating material can be used as the isolation regions for the semiconductor devices to be formed in the wafer and, therefore, have been labeled with reference number 26 in order to correspond with FIG. 1. Although not shown, an additional liner or liners can be formed after etching of the insulating material 30. Portions of these liners, if any, that cover a bottom surface of the trench should be removed.

As illustrated in FIG 5a, the bottom surface 34 may be rough after the second etch step is performed. (The illustrated roughness is, in all likelihood, grossly exaggerated in order to illustrate the point.) As a result, this bottom surface 34 is preferably treated to create a clean and smooth surface that is better suited for the epitaxial growth process that will be performed. A number of embodiments to perform this treatment step can be performed.

Figure 5B:
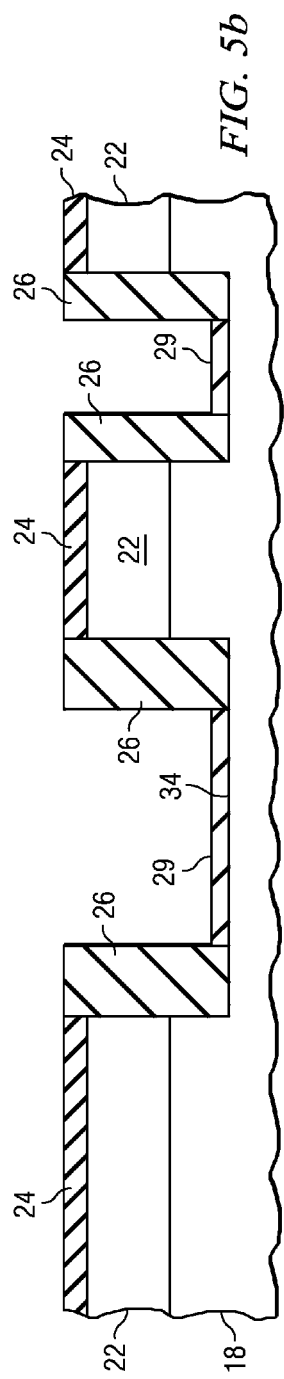
FIG. 5b illustrates the trenches within the insulating material with an oxide layer over the bottom surface of the trenches.
Figure 6:
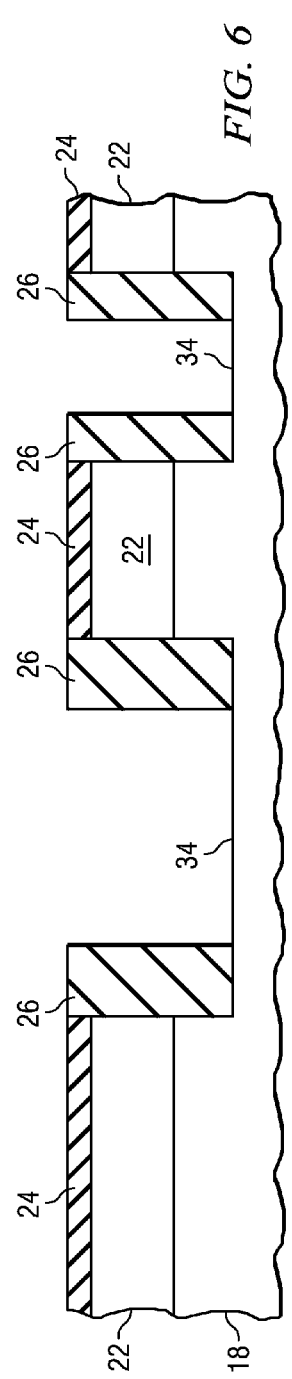
FIG. 6 illustrates the trenches within the insulating material with a clean smooth surface.

In a first embodiment, in FIG. 5b, a low temperature oxide 29 is grown using a thermal process. For example, an oxide layer can be grown to consume an upper portion of the trench surface 34. In one embodiment, less than 10 nm, e.g., about 2 to 5 nm, of silicon is consumed. This oxide layer 29 can then be removed using, for example, a dilute buffered oxide etch (BOE). The resulting smooth surface is shown in FIG. 6.

In a second embodiment, a chemical treatment can be performed to smooth the surface 34. For example, a chemical treatment can be performed to oxidize the surface 34. This oxide 29 can then be removed using an appropriate etch, e.g., a HF etch. For example, less than 10 nm of silicon, e.g., about 3 nm of silicon, can be removed using this process. This cycle can be repeated as necessary to create the desired surface.

Figure 9:
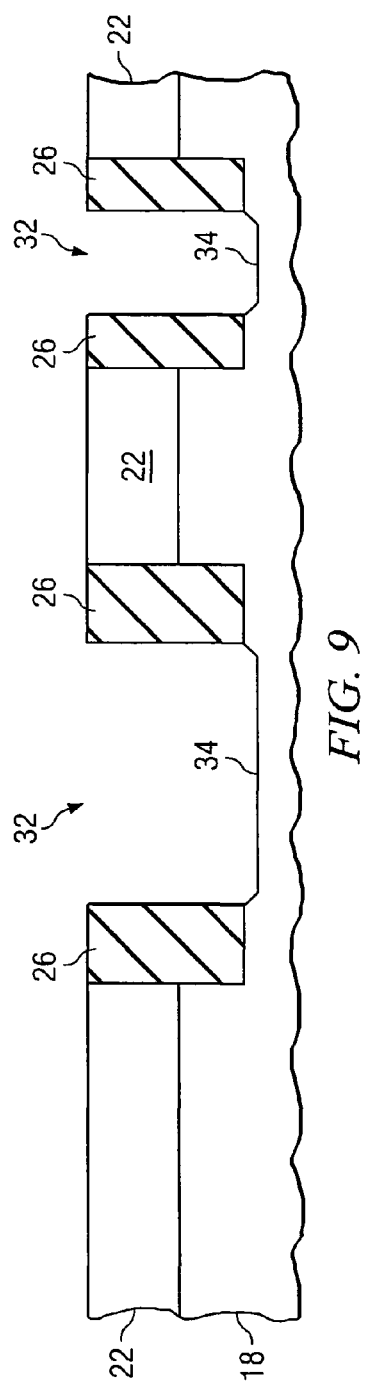
FIG. 9 illustrates an alternate embodiment for one step of the method.

FIG. 9 illustrates the resultant structure after an alternate embodiment process is performed. In this embodiment, a reactive ion etch performed in the previously described process is replaced by, or supplemented with, a wet etch. For example, the wafer can be etched with a KOH etchant. KOH can be used for an anisotropic etch into the (110) silicon and a concave etch in the (100) silicon.

Figure 7:
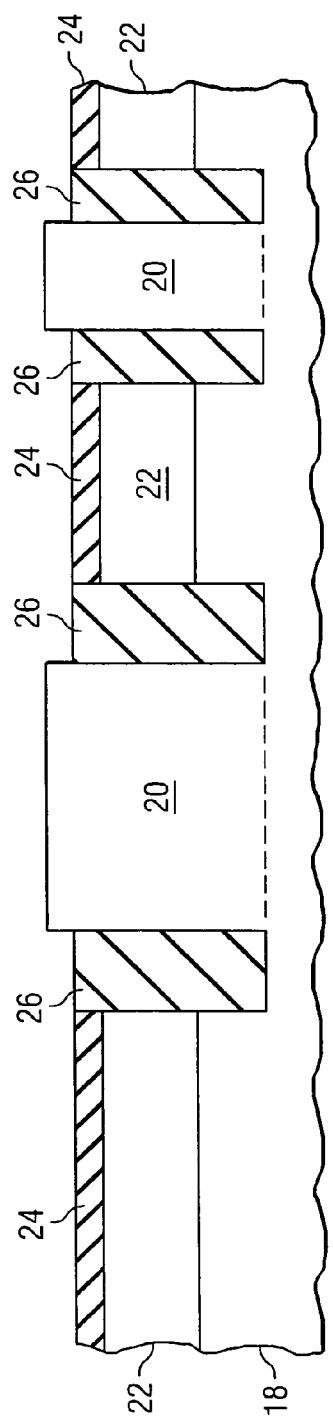
FIG. 7 illustrates the trenches with a re-grown semiconductor.

In one embodiment, the KOH etch is used for the (100) Si surface treatment before the epitaxial growth (shown in FIG. 7). The KOH etch is performed after the filled oxide etch of FIG 5a but before the epitaxially growth of FIG. 7. In this embodiment, the KOH etch does not etch either the first layer of silicon 22 or the filled insulator layer 30.

Referring next to FIG. 7, which may succeed either FIG. 6 or FIG. 9, semiconductor regions 20 are epitaxially grown using semiconductor layer 18 as a seed layer and will, therefore, be grown with the same crystal orientation. In the illustrated embodiment, the hard mask layer 24 prevents the growth of silicon over layer 22. In a preferred embodiment, the semiconductor material of layer 20 is the same as the semiconductor material of the underlying layer 18. In other embodiments, however, this need not be the case. For example, to form a strained semiconductor layer, a layer of silicon can be grown over a silicon-germanium body 18 and/or 22, e.g., a silicon germanium substrate or a silicon-germanium layer over a substrate. In other examples, other combinations of materials are possible.

Figure 8:
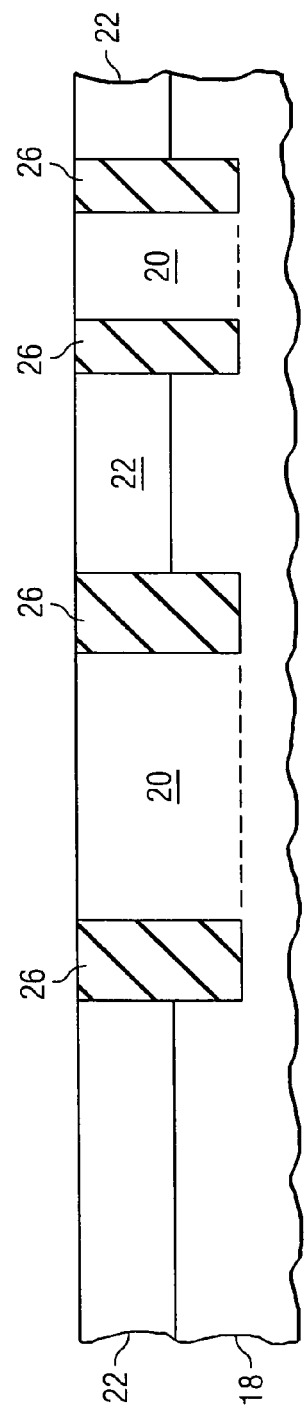
FIG. 8 illustrates the trenches after planarization.

In the preferred embodiment, the layer 20 is grown to a level that extends past the top surface of the upper layer 22. As shown in FIG. 8, the top surface of the silicon regions 20 and 22 are planarized to be substantially co-planar. The upper portions of the silicon layers 20 and 22 can be used as active areas, e.g., to form transistor devices as shown in FIG. 1. These active areas are separated by isolation regions 26.

While it is preferable that the active areas 20/22 and isolation regions 26 are co-planar, this is not required. The planarization step is preferably performed using a chemical-mechanical polish (CMP). Other planarization techniques, such as etch back, can alternatively be used. In an alternate embodiment, a thermal oxide (not shown) can be grown over the active areas 20/22 and then removed to create a fresh silicon surface. Other alternatives include the post thermal anneal to remove the defects and improve the top silicon layer quality.

The structure of FIG. 8 can now be used as the starting point for device fabrication. For example, transistors 12 and 14 can be formed as shown in FIG. 1. Other components such as diodes, resistors, capacitors can also be fabricated to form the desired circuits. It is noted that the structure of FIG. 8 varies from the structure of FIG. 1. These differences are intended to demonstrate that the present invention is applicable in a variety of contexts.

Figure 10:
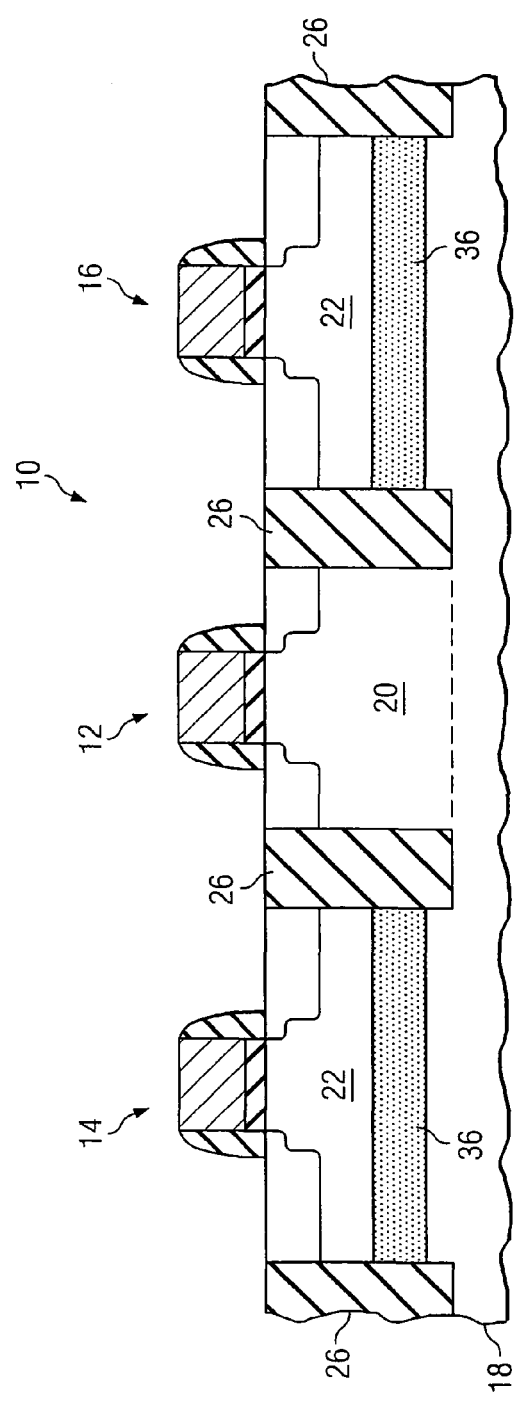

An alternate embodiment is illustrated in FIG. 10. In FIG. 10, an SOI (semiconductor on insulator) wafer is used as the starting point. For example, the bonded wafer illustrated in FIG. 2 can be replaced with an SOI wafer that includes a buried insulator 36 between the substrate 18 and the layer 22. The first etch process, described with respect to FIG. 3, can be performed to etch through semiconductor layer 22 and also buried insulator 36 in order to expose the semiconductor layer 18. The process could then be continued as otherwise described herein.

In another embodiment, illustrated by the resultant structure of FIG. 11, the embodiment of FIG. 10 could be modified so that the first etch ends before the upper surface of the substrate 18. The depth of this etch will determine the depth of the STI regions. For example, the first etch could end at the upper surface of the buried insulator 36. The second etch would then be used to etch through the buried insulator 36 as well as the insulator filling 30.

FIG. 12 illustrates an embodiment that was fabricated using the process described in co-pending patent application Ser. No. 11/047,928, which was filed on Feb. 1, 2005 and is incorporated herein by reference. Any of the techniques discussed herein can be incorporated in the process of the co-pending application. For example, the surface smoothing techniques described above can be performed prior to growing semiconductor layer 20 and the upper portion of 22, as taught in the co-pending application.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for making a semiconductor device, the method comprising:
   providing a semiconductor wafer that includes a first semiconductor layer overlying a second semiconductor layer;
   etching a first trench in the semiconductor wafer;
   filling the first trench with insulating material;

etching a second trench within the first trench and through the insulating material such that insulating material remains along sidewalls of the first trench and such that the remaining insulating material forms shallow trench isolation regions, the second trench exposing a portion of the second semiconductor layer; and growing a semiconductor layer within the second trench using the second semiconductor layer as a seed layer.

2. The method of claim 1, further comprising planarizing an upper surface of the semiconductor wafer after growing the semiconductor layer, wherein an upper surface of the grown semiconductor layer is substantially co-planar with an upper surface of the first semiconductor layer.

3. The method of claim 1, wherein the first semiconductor layer has a first crystal orientation and the second semiconductor layer has a second crystal orientation different than the first crystal orientation.

4. The method of claim 3, further comprising forming a p-channel transistor in the first semiconductor layer and forming an n-channel transistor in the grown semiconductor layer.

5. The method of claim 4, wherein the first crystal orientation comprises a (110) crystal orientation and wherein the second crystal orientation comprises a (100) crystal orientation.

6. The method of claim 1, further comprising forming an n-channel transistor in the first semiconductor layer and forming a p-channel transistor in the grown semiconductor layer.

7. The method of claim 1, wherein providing the semiconductor wafer comprises providing the semiconductor wafer that includes the first semiconductor layer in direct contact with the second semiconductor layer.

8. A method of making a semiconductor device, the method comprising:

providing a semiconductor wafer that includes a first semiconductor layer overlying a second semiconductor layer, the first semiconductor layer having a first crystal orientation and the second semiconductor layer having a second crystal orientation different than the first crystal orientation;

etching a trench in the semiconductor wafer to expose a portion of the second semiconductor layer;

forming insulating material along sidewalls of the trench thereby forming trench isolation regions;

treating the exposed portion of the second semiconductor layer;

growing a semiconductor layer using the treated, exposed portion of the second semiconductor layer as a seed layer, the semiconductor layer being grown in alignment with and abutting against the insulating material; and forming a transistor of a first conductivity type in the first semiconductor layer and forming a transistor of a second conductivity type in the grown semiconductor layer, the transistor of the first conductivity type being isolated from the transistor of the second conductivity type by the insulating material that was formed along the sidewalls of the trench.

9. The method of claim 8, wherein treating comprises removing an oxide layer with a dilute buffered oxide etch.

10. The method of claim 8, wherein treating comprises removing an oxide layer layer with a solution including HF.

11. The method of claim 8, wherein treating the exposed portion of the second semiconductor layer comprises performing a wet etch.

12. The method of claim 8, wherein treating the exposed portion of the second semiconductor layer comprises performing a wet etch using KOH.

13. A method of making a semiconductor device, the method comprising:

providing a semiconductor wafer that includes a first semiconductor layer overlying a second semiconductor layer, the first semiconductor layer having a first crystal orientation and the second semiconductor layer having a second crystal orientation different than the first crystal orientation;

etching a first trench in the semiconductor wafer;

filling the first trench with insulating material;

etching a second trench within the first trench to expose a portion of the second semiconductor layer, the second trench being smaller than the first trench such that portions of the insulating material remain along sidewalls of the first trench and form a shallow trench isolation region;

treating an exposed portion of the second semiconductor layer whereby any roughness in the exposed portion of the second semiconductor layer is smoothened;

growing a semiconductor layer using the treated, exposed portion of the second semiconductor layer as a seed layer such that the grown semiconductor layer has the second crystal orientation, the grown semiconductor layer being grown in alignment with and abutting against the insulating material;

planarizing an upper surface of the semiconductor wafer after growing the semiconductor layer such that an upper surface of the grown semiconductor layer is substantially co-planar with an upper surface of the first semiconductor layer; and forming a transistor of a first conductivity type in the upper surface of the first semiconductor layer and forming a transistor of a second conductivity type in the upper surface of the grown semiconductor layer, the transistor of the first conductivity type being isolated from the transistor of the second conductivity type by the insulating material that was formed along the sidewalls of the trench.

14. The method of claim 13, wherein providing the semiconductor wafer comprises providing an SOI wafer that includes a buried insulator disposed between the first semiconductor layer and the second semiconductor layer.

15. The method of claim 8, wherein the first semiconductor layer has a first crystal orientation and the second semiconductor layer has a second crystal orientation different than the first crystal orientation.

16. The method of claim 8, wherein the first crystal orientation comprises a (110) crystal orientation and wherein the second crystal orientation comprises a (100) crystal orientation 17. The method of claim 8, further comprising forming an n-channel transistor in the first semiconductor layer and forming a p-channel transistor in the grown semiconductor layer.

18. The method of claim 13, wherein the first crystal orientation comprises a (110) crystal orientation and wherein the second crystal orientation comprises a (100) crystal orientation.

19. The method of claim 1, further comprising treating the exposed portion of the second semiconductor layer prior to growing the semiconductor layer within the second trench.

20. The method of claim 8, wherein treating comprises forming an oxide layer at the exposed portion of the semiconductor layer and removing the oxide layer.

21. The method of claim 20, wherein forming the oxide layer comprises thermally growing the oxide layer or chemically growing the oxide layer.

22. The method of claim 13, further comprising treating the exposed portion of the second semiconductor layer, whereby any roughness in the exposed portion of the second semiconductor layer is smoothed.

* * * * *